(12) United States Patent
Coumou et al.

(10) Patent No.: US 12,165,843 B2
(45) Date of Patent: Dec. 10, 2024

(54) FLEETWIDE IMPEDANCE TUNING PERFORMANCE OPTIMIZATION

(71) Applicant: Applied Materials, Inc., Santa Clara, CA (US)

(72) Inventors: David Coumou, Webster, NY (US); Nathan Ransom, Rochester, NY (US); Priya Gambhire, Bengaluru (IN); Jeremy Zuch, Pittsford, NY (US); Senthil Kumar Vadivelu, Bangalore (IN)

(73) Assignee: Applied Materials, Inc., Santa Clara, CA (US)

(*) Notice: Subject to any disclaimer, the term of this patent is extended or adjusted under 35 U.S.C. 154(b) by 214 days.

(21) Appl. No.: 17/981,282

(22) Filed: Nov. 4, 2022

(65) Prior Publication Data
US 2024/0153743 A1    May 9, 2024

(51) Int. Cl.
*C23C 14/54* (2006.01)
*H01J 37/32* (2006.01)
*H01J 47/02* (2006.01)
*H03H 7/38* (2006.01)

(52) U.S. Cl.
CPC .. *H01J 37/32183* (2013.01); *H01J 37/32256* (2013.01)

(58) Field of Classification Search
CPC .......... H01J 37/32183; H01J 37/32256; H01J 37/32935; H01J 37/3299
See application file for complete search history.

(56) References Cited

U.S. PATENT DOCUMENTS

| | | | |
|---|---|---|---|
| 2010/0009096 A1 | 1/2010 | Kawamura et al. | |
| 2018/0053633 A1 | 2/2018 | Glazek et al. | |
| 2020/0051787 A1* | 2/2020 | Shinagawa | H01J 37/32183 |
| 2021/0249161 A1* | 8/2021 | Horak | H02B 11/04 |
| 2021/0313948 A1* | 10/2021 | Leeser | H01J 37/32183 |

(Continued)

FOREIGN PATENT DOCUMENTS

| | | |
|---|---|---|
| KR | 1020080094155 A | 10/2008 |
| WO | 2006044722 A2 | 4/2006 |

OTHER PUBLICATIONS

International Search Report and Written Opinion from PCT/US2023/034515 dated Jan. 29, 2024, 8 pgs.

*Primary Examiner* — Minh D A
(74) *Attorney, Agent, or Firm* — Schwabe, Williamson & Wyatt, P.C.

(57) ABSTRACT

Embodiments disclosed herein include a method for field adjusting calibrating factors of a plurality of RF impedance matches for control of a plurality of plasma chambers. In an embodiment, the method comprises collecting and storing in a memory data from operation of the plurality of RF impedance matches, and finding a tune space for each of the plurality of RF impedance matches from the collected data. In an embodiment, the method further comprises finding adjustments to account for variability in each of the plurality of RF impedance matches, finding adjustments to variable tuning elements of the plurality of RF impedance matches to account for time varying and process related load impedances, and the method further comprises obtaining operating windows for the variable tuning elements in the plurality of RF impedance matches.

19 Claims, 8 Drawing Sheets

(56) References Cited

U.S. PATENT DOCUMENTS

| | | | |
|---|---|---|---|
| 2022/0139674 A1* | 5/2022 | Shaw | H03H 7/38 |
| | | | 315/111.21 |
| 2022/0189740 A1* | 6/2022 | Oliveti | H01J 37/32183 |
| 2022/0301826 A1 | 9/2022 | Russell et al. | |

* cited by examiner

FLEETWIDE IMPEDANCE TUNING PERFORMANCE OPTIMIZATION

BACKGROUND

1) Field

Embodiments relate to the field of semiconductor manufacturing and, in particular, to fleetwide control of impedance tuning for process performance optimization.

2) Description of Related Art

In semiconductor processing environments, especially high volume manufacturing (HVM) environments, it is often desirable to process devices in parallel with each other. For example, a plurality of plasma chambers may be used in parallel in order to execute a given process recipe in the creation of the devices. This leads to improved yield and throughput. Ideally, the plurality of plasma chambers are perfectly matched so as to output a uniform outcome across all devices. However, matching multiple chambers is exceedingly difficult. This matching process is becoming more critical as device dimensions continue to scale to smaller values.

For example, two recently cleaned chambers may operate differently. This could be due to any number of differences in the chambers, including sensor variation, aging effects, or the like. With so many variables that may differ, it is difficult to match even very similar processing chambers. Chambers that are not matched also makes it more difficult to determine when a processing excursion occurs that needs to be addressed (e.g., by cleaning, adjusting parameters, or the like).

SUMMARY

Embodiments disclosed herein include a method for field adjusting calibrating factors of a plurality of RF impedance matches for control of a plurality of plasma chambers. In an embodiment, the method comprises collecting and storing in a memory data from operation of the plurality of RF impedance matches, and finding a tune space for each of the plurality of RF impedance matches from the collected data. In an embodiment, the method further comprises finding adjustments to account for variability in each of the plurality of RF impedance matches, and finding adjustments to variable tuning elements of the plurality of RF impedance matches to account for time varying and process related load impedances. In an embodiment, the method further comprises obtaining operating windows for the variable tuning elements in the plurality of RF impedance matches.

Embodiments further comprise a method for field adjusting calibrating factors of a plurality of RF impedance matches with a first variable tuning element and a second variable tuning element for control of a plurality of plasma chambers. In an embodiment, the method comprises collecting data for the plurality of RF impedance matches, clustering the collected data into a plurality of data clusters, reconciling the data clusters to minimize impedance tuning variability between the plurality of RF impedance matches, and updating calibration factors for each of the plurality of RF impedance matches using the data reconciliation.

Embodiments may further plasma processing system. In an embodiment, the plasma processing system may comprise a controller, a plurality of plasma chambers, where each plasma chamber comprises an RF match, and wherein the controller is configured to calibrate the RF matches for the plurality of plasma chambers using an RF match correction algorithm.

DETAILED DESCRIPTION

Systems described herein include fleetwide control of impedance tuning for process performance optimization. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, chamber matching is an important processing parameter when operating in a high volume manufacturing (HVM) environment. Particularly, excellent chamber matching enables high yield and high throughput. However, as devices scale to smaller dimensions, the pressure on improving chamber matching continues to increase.

Accordingly, embodiments disclosed herein include processes and devices to implement methods for field adjusting calibrating factors of a plurality of RF impedance matches for control of a plurality of plasma chambers. Generally, an RF impedance match is a device that controls an impedance seen by an RF source so that it matches the variable impedance inside the chamber in order to minimize reflected power. The impedance within the chamber may change as a result of different processing conditions that may alter the characteristics of a plasma within the chamber. As such, precise control and monitoring of the RF impedance match may be used to improve chamber performance. Matching RF impedance matches may also allow for easier detection of process excursions.

In embodiments disclosed herein, control algorithms are used in order to adjust calibration factors of a plurality of RF impedance matches. The control algorithm may first include collecting data from the plurality of RF impedance matches. The collected data is then clustered into a plurality of data clusters. Each data cluster may include the settings of variable tuning elements (e.g., variable capacitors) for each RF impedance match at a particular processing condition (e.g., at a particular process step in a recipe). After data clusters are found, a reconciliation process is used to minimize impedance tuning variability between the plurality of RF impedance matches. The reconciliation process may involve linear equality constraints in some embodiments. Though, other types of constraints may also be used in other instances. In some embodiments, the control algorithm may continue with updating calibration factors for each of the plurality of RF impedance matches using the data reconciliation. The calibration factors may include maximum and minimum set points for the variable tuning elements for each of the RF impedance matches.

Figure 1A:
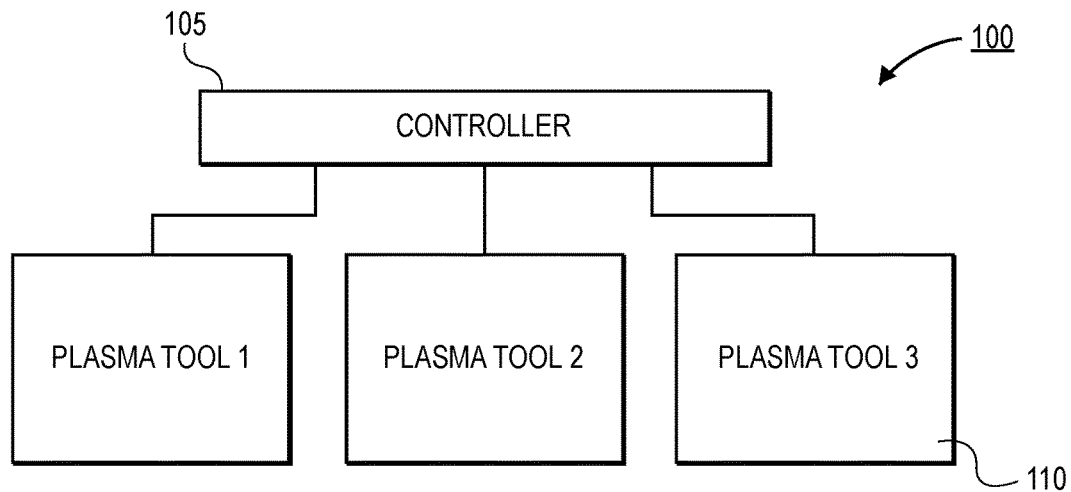
FIG. 1A is a schematic diagram of a semiconductor processing environment that includes a controller for controlling a plurality of plasma processing tools, in accordance with an embodiment.

Referring now to FIG. 1A, a schematic illustration of semiconductor processing environment 100 is shown, in accordance with an embodiment. In an embodiment, the semiconductor processing environment 100 may include a controller 105. The controller 105 may be used to control a plurality of semiconductor processing tools 110, such as plasma tools or the like. The controller 105 may be implemented as a standalone computing system, or the controller 105 may be integrated within a server or other remote processing architecture.

In the illustrated embodiment, the plurality of semiconductor processing tools 110 includes three plasma tools (i.e., Plasma Tool 1, Plasma Tool 2, and Plasma Tool 3). However, it is to be appreciated that there may be any number of semiconductor processing tools 110 communicatively coupled to the controller 105. The plurality of semiconductor processing tools 110 may be substantially similar to each other. For example, each of the semiconductor processing tools 110 may be configured to perform the same processing operation(s) (or process step(s)) of a recipe used to fabricate devices (e.g., transistors, memory devices, solar cells, microelectromechanical systems (MEMS), or the like). Additionally, the controller 105 may be part of a system used to control other processing tools (not shown) used to continue fabrication of the devices. That is, the controller 105 may not necessarily be dedicated to the control of the semiconductor processing tools 110.

In an embodiment, the controller 105 may be configured to provide chamber matching operations between the semiconductor processing tools 110. For example, as will be described in greater detail below, the controller 105 may be configured to implement an RF match correction algorithm. Even when properly maintained, cleaned, etc. the semiconductor processing tools 110 may exhibit differences in the tuning of the variable tuning elements in the RF matches. That is, for a given load impedance in the semiconductor processing tool, the variable tuning elements in the different semiconductor processing tools 110 may require different set points. This can make it difficult to determine issues such as when process excursions exist, to identify when cleaning is needed, to identify when consumable parts need replacing, and the like. Properly calibrating the RF matches using methods disclosed herein alleviates these challenges.

Figure 1B:
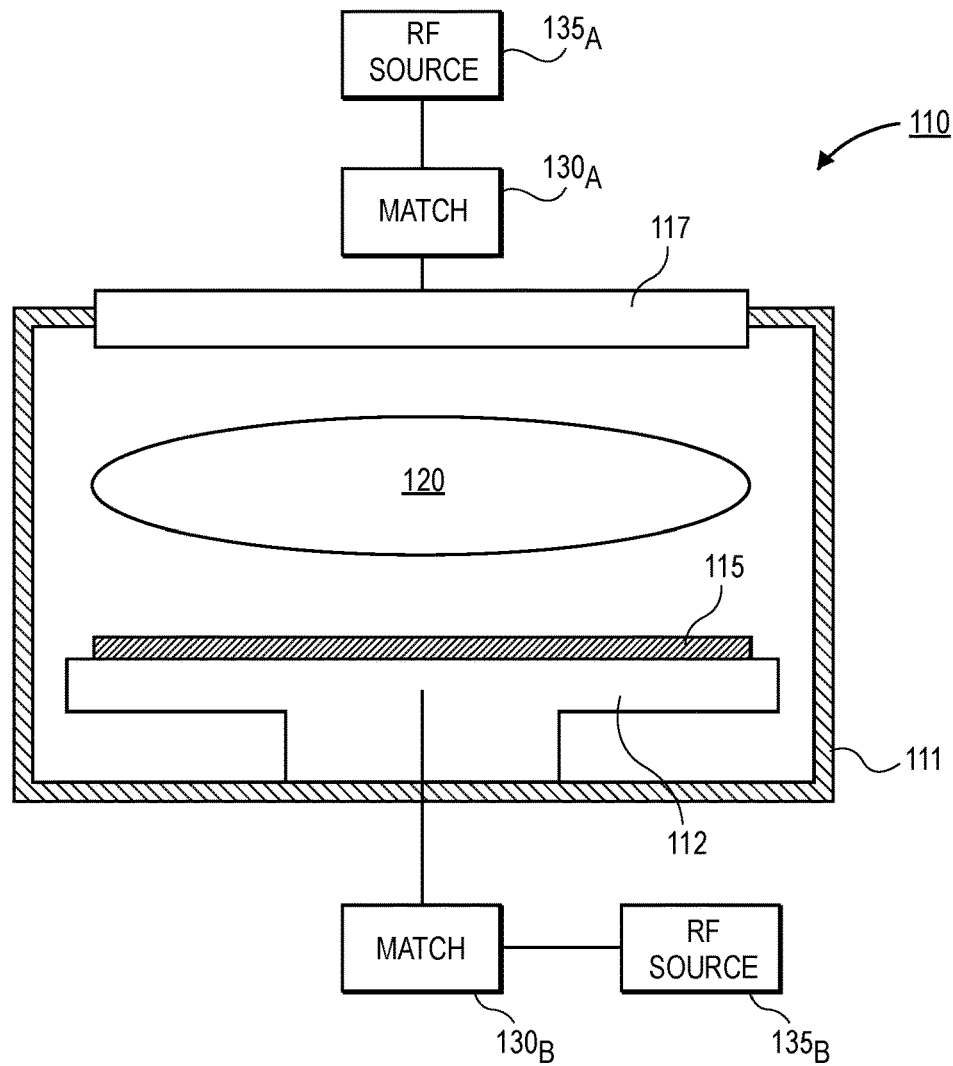
FIG. 1B is a cross-sectional illustration of a plasma processing tool with a first RF generator and a second RF generator, in accordance with an embodiment.

Referring now to FIG. 1B, a cross-sectional illustration of a semiconductor processing tool 110 is shown, in accordance with an embodiment. In an embodiment, the semiconductor processing tool 110 may comprise a chamber 111. The chamber 111 may be suitable for maintaining a low pressure (e.g., close to vacuum pressure) environment capable of supporting formation of a plasma 120 in the chamber 111. Portions of the chamber 111 are omitted for simplicity. For example, exhaust and pumping architectures for maintaining a vacuum pressure are omitted from FIG. 1B.

In an embodiment, the semiconductor processing tool 110 may include a pedestal 112 for supporting a substrate 115. The pedestal 112 may include a chuck, such as an electrostatic chuck (ESC) or the like. In some embodiments, the pedestal 112 may further include heating and/or cooling elements in order to control a temperature of the substrate 115. In an embodiment, the substrate 115 may include any typical form factor used in semiconductor processing. For example, the substrate 115 may have a wafer form factor (e.g., 200 mm, 300 mm, 450 mm, etc.). The substrate 115 may comprise silicon or other semiconductor materials. However, the substrate 115 may also comprise non-semiconductor materials, such as glass, sapphire, or the like.

In an embodiment, the semiconductor processing tool 110 may comprise a showerhead 117 or another lid type structure. The showerhead 117 may be positioned opposite from the pedestal 112. The showerhead 117 may be configured to flow one or more processing gasses or inert gasses into the chamber 111.

In an embodiment, a first RF source $135_A$ is coupled to the showerhead 117. The first RF source $135_A$ (e.g., an RF generator) may provide RF power to the chamber 111 in order to ignite and maintain a plasma 120 in the chamber 111. A first RF impedance match $130_A$ may be provided between the first RF source $135_A$ and the showerhead 117. The first RF impedance match $130_A$ may include one or more variable tuning elements (not show) that allow for the impedance to be altered in order to match a load impedance of the plasma 120 in the chamber 111. For example, the variable tuning elements may include variable capacitors or the like.

In an embodiment, a second RF source $135_B$ is coupled to the pedestal 112. The second RF source $135_B$ may be separated from the pedestal 112 by a second RF impedance match $130_B$. The second RF impedance match $130_B$ may be substantially similar to the first RF impedance match $130_A$. For example, the second RF impedance match $130_B$ may comprise a pair of variable tuning elements (e.g., variable capacitors) in order to modify an impedance to match the impedance of the plasma 120 in the chamber 111.

In an embodiment, one or both of the first RF impedance match $130_A$ and the second RF impedance match $130_B$ may be controlled by a controller 105. The controller 105 may implement an RF match correction algorithm in the RF impedance matches. The RF match correction algorithm may tune the RF impedance matches so that they are matched with the RF impedance matches of other semiconductor processing tools 110. The RF match correction algorithm is described in greater detail below.

Figure 2A:
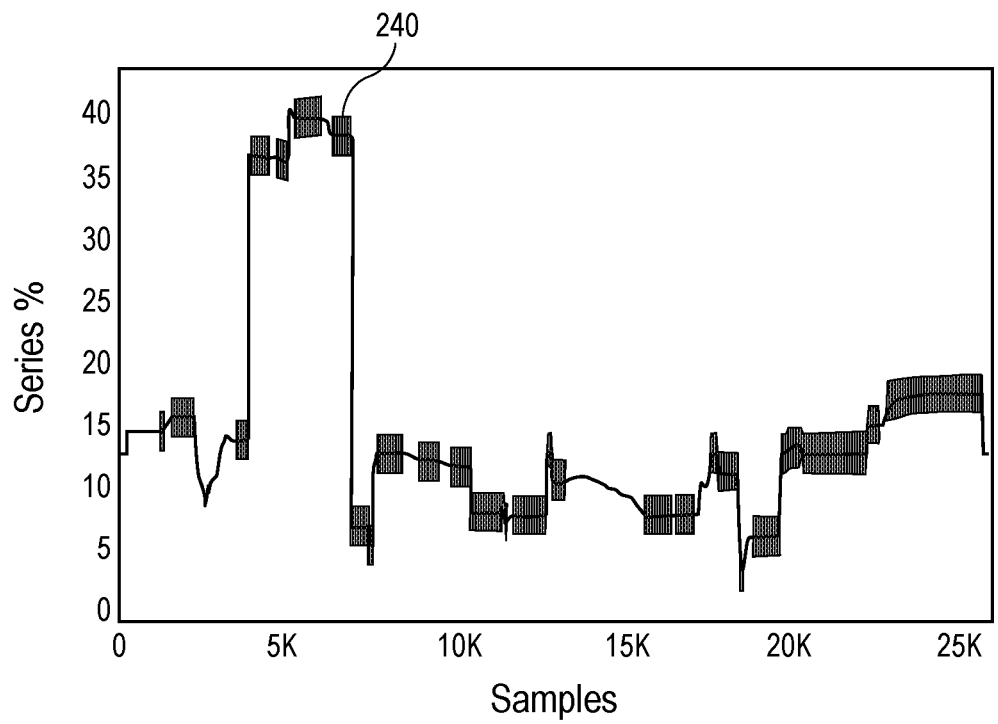
FIG. 2A is a graph of recorded data that shows the clustering of first variable tuning elements, in accordance with an embodiment.
Figure 2B:
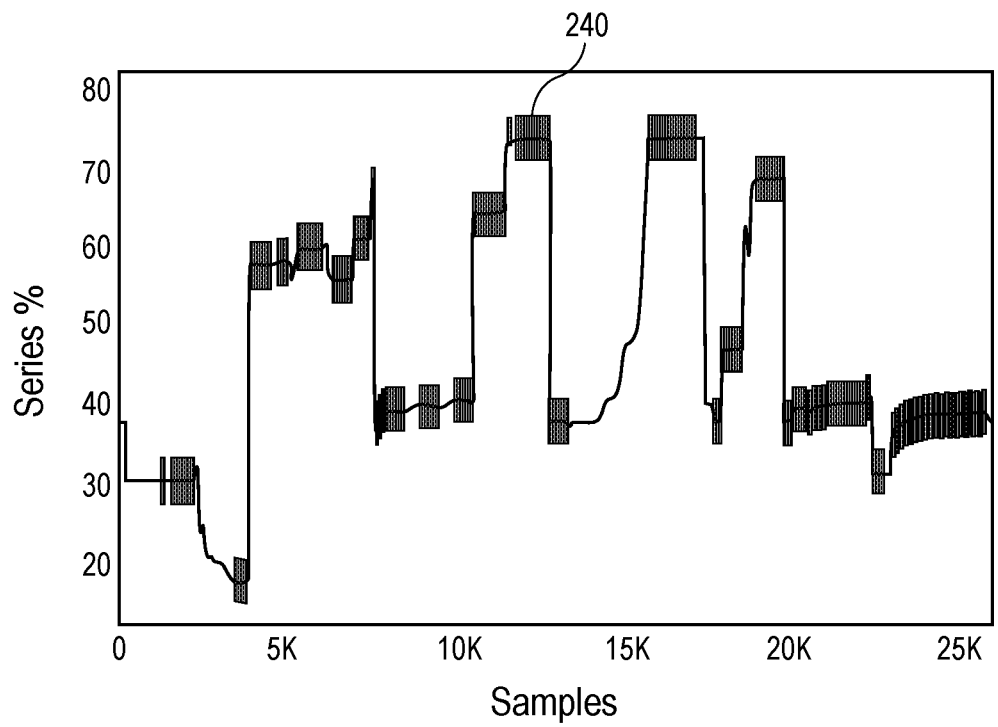
FIG. 2B is a graph of recorded data that shows clustering of second variable tuning elements, in accordance with an embodiment.

Referring now to FIGS. 2A and 2B, a pair of plots showing capacitance values for variable tuning elements in a plurality of RF impedance matches is shown, in accordance with an embodiment. The plot in FIG. 2A may be a series capacitance, and the plot in FIG. 2B may be a shunt capacitance. In the embodiments shown in FIGS. 2A and 2B, a data collection operation is shown. That is, data from a plurality of RF impedance matches are collected to provide series capacitance and shunt capacitance values for a plurality of different processing conditions. The recorded values may be grouped into clusters 240. Each cluster 240 may refer to the capacitance values of RF impedance matches for a given processing condition. For example, the plurality of RF impedance matches may all run the same process recipe. At each operation of the process recipe (e.g., when a steady state condition is reached) the values of the capacitors (e.g., the series capacitance and the shunt capacitance) may be recorded, and the grouping of values may be referred to as a cluster.

As will be described in greater detail below, each of the clusters 240 may include capacitance values that are different from each other. That is, even though the same processing conditions are obtained in the different semiconductor processing tools, the RF impedance matches may exhibit different capacitance settings. A goal of embodiments described herein is to reconcile those differences in order to unify the settings of the RF impedance matches. This allows for tighter control and easier identification of process excursions and the like.

Figure 3A:
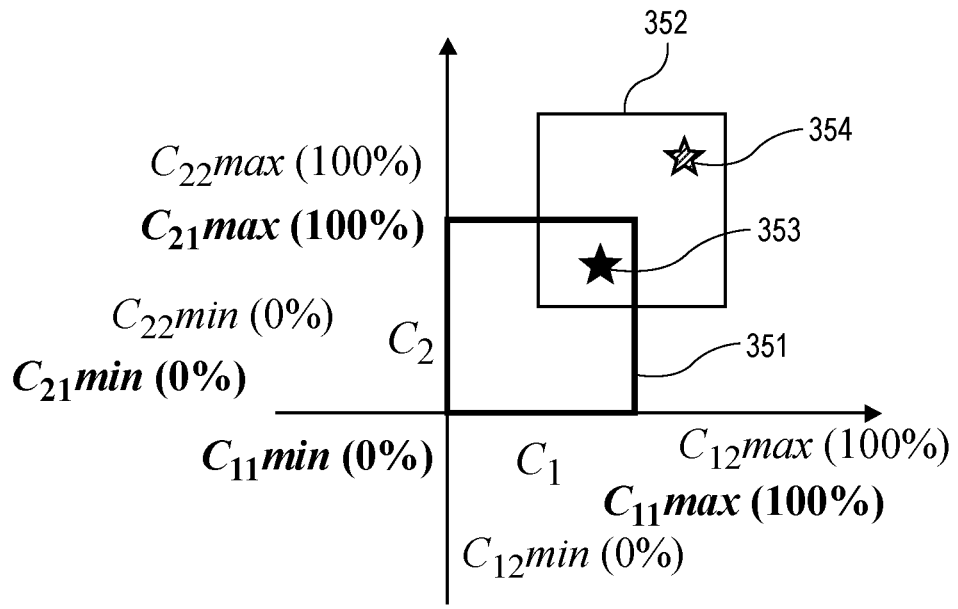
FIG. 3A is a plot of the tune space for a first RF impedance match and a second RF impedance match before calibration, in accordance with an embodiment.

Referring now to FIG. 3A, a plot of a first RF impedance match 351 and a second RF impedance match 352 is shown, in accordance with an embodiment. In the plot shown in FIG. 3A, the X-axis represents a first capacitance value ($C_1$), and the Y-axis represents a second capacitance value ($C_2$). The box for the first RF impedance match 351 illustrates the $C_1$ minimum and maximum (i.e., $C_{11min}$ and $C_{11max}$) and the $C_2$ minimum and maximum (i.e., $C_{21min}$ and $C_{21max}$). The box for the second RF impedance match 352 illustrates the $C_1$ minimum and maximum (i.e., $C_{12min}$ and $C_{12max}$) and the $C_2$ minimum and maximum (i.e., $C_{22min}$ and $C_{22max}$). The stars 353 and 354 represent the tuned condition for the first RF impedance match 351 and the second RF impedance match 352, respectively.

The first RF impedance match 351 and the second RF impedance match 352 are part of a cluster. However, as shown by the offset boxes, the first RF impedance match 351 and the second RF impedance match 352 are not matched. That is, even when properly tuned to minimize reflected power for the same processing condition, the first RF impedance match 351 and the second RF impedance match 351 may not be unified with each other. This makes it difficult to identify excursions of individual semiconductor processing tools in a group of semiconductor processing tools. That is, the semiconductor processing tools are not adequately matched to each other.

Figure 3B:
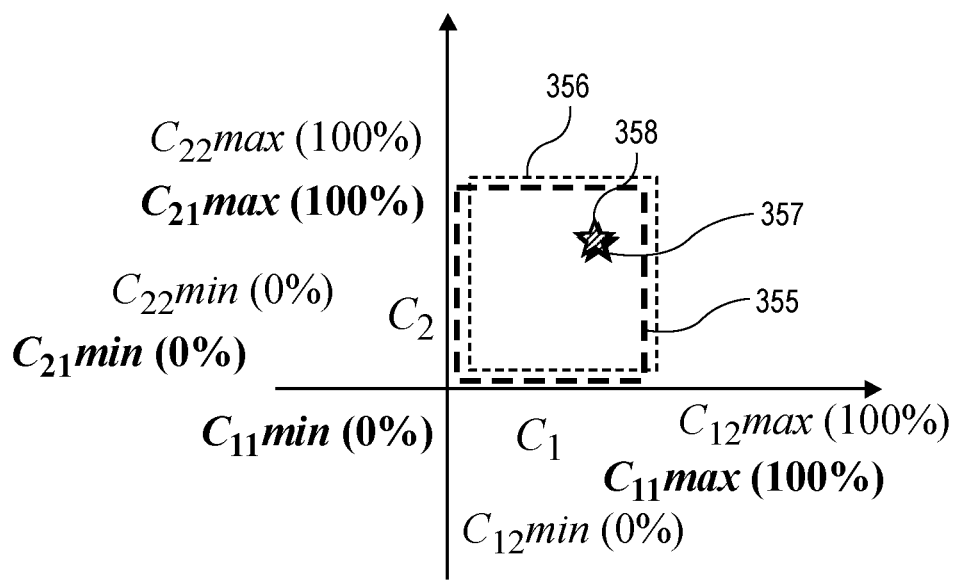
FIG. 3B is a plot of the tune space for a first RF impedance match and a second RF impedance match after calibration, in accordance with an embodiment.

Accordingly, a reconciliation process is used in order to calibrate RF impedance match factors in order to bring the boxes in line with each other. For example, in FIG. 3B, the box 355 for the first impedance match is significantly overlapping with the box 356 for the second impedance match. While shown with a slight offset, it is to be appreciated that there may be no offset in some embodiments, and the box 355 may entirely overlap the box 356. Additionally, the tune points 357 and 358 may be substantially overlapping as well. As shown, the box 355 may be defined by a $C^*_1$ minimum and maximum (i.e., $C^*_{11min}$ and $C^*_{11max}$) and a $C^*_2$ minimum and maximum (i.e., $C^*_{21min}$ and $C^*_{21max}$), and the box 356 may be defined by a $C^*_1$ minimum and maximum (i.e., $C^*_{12min}$ and $C^*_{12max}$) and a $C^*_2$ minimum and maximum (i.e. $C^*_{22min}$ and $C^*_{22max}$).

Figure 4:
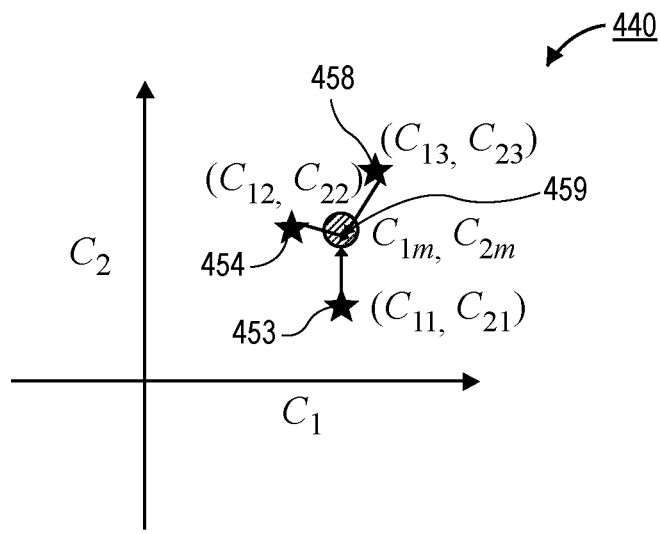
FIG. 4 is a graphical illustration of a data cluster that includes the tuned settings for three RF impedance matches that are not calibrated, in accordance with an embodiment.

Referring now to FIG. 4, a plot of a cluster 440 of a set of three tune points 453, 454, and 458 is shown, in accordance with an embodiment. Each of the tune points 453, 454, and 458 may include the setting of a first capacitor $C_1$ (X-axis) and a second capacitor $C_2$ (Y-axis). For example, tune point 453 is set at ($C_{11}$, $C_{21}$), tune point 454 is set at ($C_{12}$, $C_{22}$), and tune point 458 is set at ($C_{13}$, $C_{23}$). In order to match each of the RF impedance matches to each other a calibration factor is applied to each of the RF impedance matches in order to reconcile the differences between the tune points. For example, a tuned position 459 may have the coordinates ($C_{1m}$, $C_{2m}$) and may be a point that minimizes the differences between the tune points 453, 454, and 458.

Figure 5:
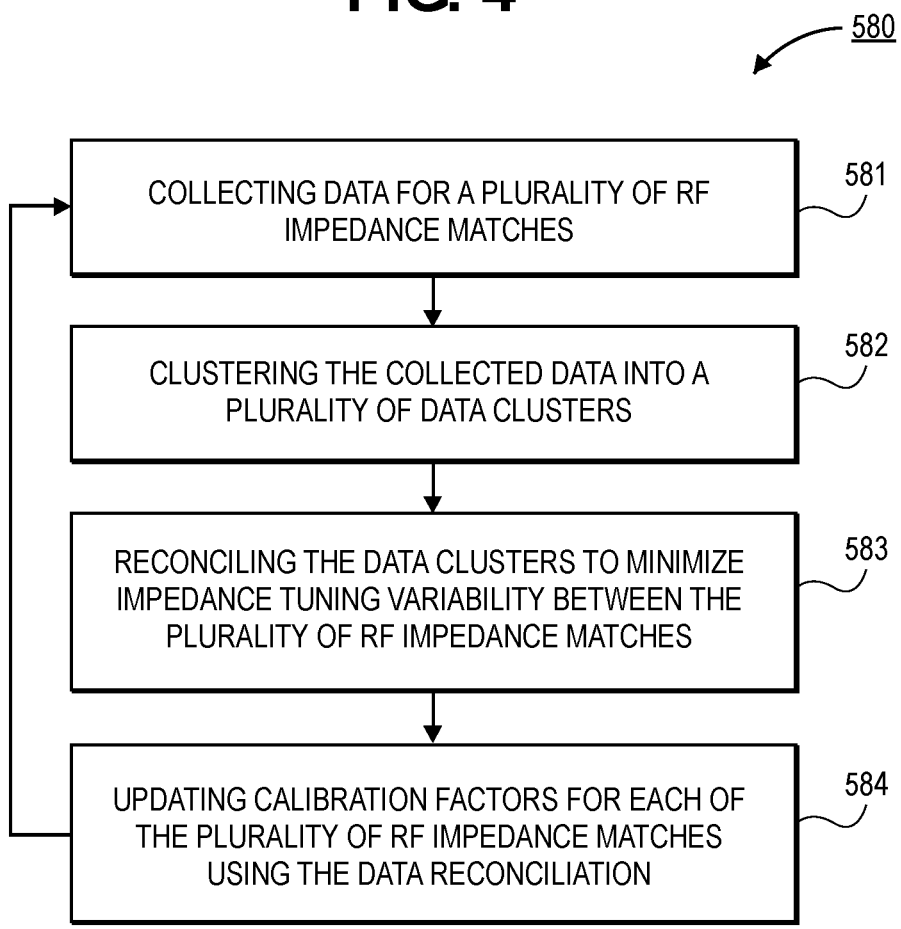
FIG. 5 is a process flow diagram depicting a process for calibrating a plurality of RF matches, in accordance with an embodiment.

Referring now to FIG. 5, a process flow diagram of a process 580 that depicts a process for field adjusting calibrating factors of a plurality of RF impedance matches with a first variable tuning element and a second variable tuning element for control of a plurality of plasma chambers is shown, in accordance with an embodiment. In an embodiment, the plurality of RF impedance matches may include two or more RF impedance matches. Additionally, the first variable tuning element and the second variable tuning element may comprise variable capacitors. In an embodiment, the process 580 may be executed by a controller that is configured to control a plurality of semiconductor processing tools that use the plurality of RF impedance matches.

In an embodiment, the process 580 begins with operation 581, which comprises collecting data for a plurality of RF impedance matches. In an embodiment, the data collection may be used to record the set points of the variable tuning elements for each of the RF impedances matches during the execution of one or more process recipes. In an embodiment, the recorded data may have a form similar to the data shown in the plots in FIGS. 2A and 2B. The recorded data may be stored in a memory local to the controller or on a remote memory device.

In an embodiment, the process 580 may continue with operation 582, which comprises clustering the collected data into a plurality of data clusters. Each of the data clusters may be a collection of settings for variable tuning elements of the plurality of RF impedance matches. For example, in the case of three RF impedance matches, a data cluster may include the first and second capacitance settings for the three RF impedance matches. The data cluster may be local to a given process recipe step. For example, a steady state condition may be reached for each of the plurality of semiconductor processing tools, and the data for each RF impedance match may be recorded. While a single data cluster is described herein, it is to be appreciated that a plurality of data clusters may be formed in order to improve accuracy of the tuning process.

In an embodiment, the process 580 may continue with operation 583, which comprises reconciling the data clusters to minimize impedance tuning variability between the plurality of RF impedance matches. In an embodiment, the reconciliation is an algorithm that allows for the generation of calibration factors that unify the RF impedance match tune points of a data cluster. For example, the tune points 453, 454, and 458 in FIG. 4 are reconciled to tune point 459.

In an embodiment, the reconciliation process is a data minimization process that includes one or more of linear equality constraints, linear inequality constraints, nonlinear equality constraints, or nonlinear inequality constraints. In the case of a linear equality constraint, the constrain of $A\hat{y}=0$ is used, where A is matrix and $\hat{y}$ is a matrix of the adjustment factors. In an embodiment, an analytical solution to reconcile the data cluster may include the format of $\hat{y}=yV\ A^T(AV\ A^T)^{-1}\ Ay$. In an embodiment, y is the matrix $$\begin{bmatrix} C_{11} \\ C_{12} \\ C_{21} \\ C_{22} \\ C_{31} \\ C_{32} \end{bmatrix}$$

and $\hat{y}$ is the matrix $$\begin{bmatrix} \hat{C}_{11} \\ \hat{C}_{12} \\ \hat{C}_{21} \\ \hat{C}_{22} \\ \hat{C}_{31} \\ \hat{C}_{32} \end{bmatrix},$$

where $\hat{C}_{11}=\hat{C}_{31}$ and where $\hat{C}_{12}=\hat{C}_{22}=\hat{C}_{32}$. In order to satisfy the constrain $A\hat{y}=0$, the matrix A may be equal to $$\begin{bmatrix} 1 & 0 & -1 & 0 & 0 & 0 \\ 0 & 1 & 0 & -1 & 0 & 0 \\ 0 & 0 & 1 & 0 & -1 & 0 \\ 0 & 0 & 0 & 1 & 0 & -1 \end{bmatrix}.$$

In an embodiment, the matrix V may be a covariance matrix equal to $$\begin{bmatrix} \sigma_{11}^2 & 0 & 0 & 0 & 0 & 0 \\ 0 & \sigma_{12}^2 & 0 & 0 & 0 & 0 \\ 0 & 0 & \sigma_{21}^2 & 0 & 0 & 0 \\ 0 & 0 & 0 & \sigma_{22}^2 & 0 & 0 \\ 0 & 0 & 0 & 0 & \sigma_{31}^2 & 0 \\ 0 & 0 & 0 & 0 & 0 & \sigma_{32}^2 \end{bmatrix},$$

where each $\sigma$ value is a measure of the variability of the individual capacitors (e.g., variability in the motor positions). In an embodiment, the RF impedance matches can be characterized in a two-dimensional $C_1$-$C_2$ space. However, in other embodiments, the reconciliation may be adapted to motor steps of the capacitors or any hyper dimensional representation.

In an embodiment, the process 580 may continue with operation 584, which comprises updating calibration factors for each of the plurality of RF impedance matches using the data reconciliation. Particularly, the calibration factors may be related to the $\hat{y}$ matrix. Since the entries in the $\hat{y}$ matrix are equal to each other, the RF impedance matches can be considered to be matched for chamber matching purposes.

As such, the presence of excursions or other changes to the processing conditions can be more easily recognized by the controller. In some embodiments, the updated calibration factors may be used as part of a digital twin for subsequent processing operations.

In an embodiment, the updated calibration factors may be fed back and used in subsequent data collection processes. This enables an iterative learning process in order to more accurately monitor and track the set points of the variable tuning elements of the plurality of RF impedance matches.

Figure 6:
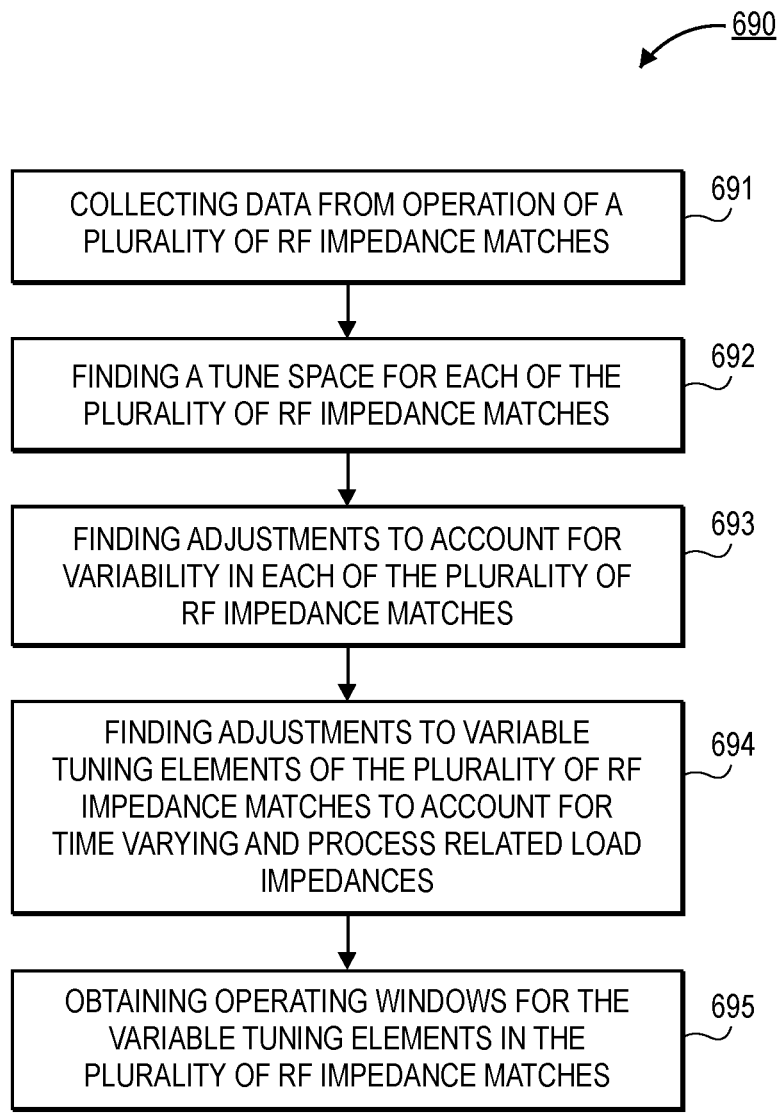
FIG. 6 is a process flow diagram depicting a process for calibrating a plurality of RF matches, in accordance with an additional embodiment.

Referring now to FIG. 6, a process flow diagram illustrating a process 690 for field adjusting calibrating factors of a plurality of RF impedance matches with a first variable tuning element and a second variable tuning element for control of a plurality of plasma chambers is shown, in accordance with an additional embodiment. The process 690 may be similar to the process 580 in some instances. Though, the process 690 may have some differences from the process 580 in some embodiments.

In an embodiment, the process 690 may begin with operation 691, which comprises collecting data from operation of a plurality of RF impedance matches. In an embodiment, the data collection may be used to record the set points of the variable tuning elements for each of the RF impedances matches during the execution of one or more process recipes. In an embodiment, the recorded data may have a form similar to the data shown in the plots in FIGS. 2A and 2B. The recorded data may be stored in a memory local to the controller or on a remote memory device.

In an embodiment, the process 690 may continue with operation 692, which comprises finding a tune space for each of the plurality of RF impedance matches. As used herein, the tune space may refer to the coordinates of a $C_1$-$C_2$ plot similar to embodiments shown in FIGS. 3A and 3B above. That is, clusters of variable tuning element settings can be recorded. The clusters (also referred to as data clusters) are groupings of multiple RF impedance match values for the same process condition. For example, a first step in a recipe may be implemented by a plurality of semiconductor processing tools, and the settings of the variable tuning elements of each of the RF impedance matches may be recorded as part of the data cluster.

In an embodiment, the process 690 may continue with operation 693, which comprises finding adjustments to account for variability in each of the plurality of RF impedance matches. In an embodiment, this process may be similar to the reconciliation process described in greater detail above. That is, using linear equality constraints, linear inequality constraints, nonlinear equality constraints, or nonlinear inequality constraints, a minimization process is used to find values for the $\hat{y}$ matrix. In some embodiments, the $\hat{y}$ matrix is found using the general formula of $\hat{y}=yV\ A^T(AV\ A^T)^{-1}\ Ay$, as described in greater detail above.

In an embodiment, the process 690 may continue with operation 694, which comprises finding adjustments to variable tuning elements of the plurality of RF impedance matches to account for time varying and process related load impedances. More generally, the operation 694 may be used to adjust the V matrix in order to account for variations in the processing chambers. For example, variations due to chamber aging, sensor performance, process variability, and/or device variability may be determined. While described as being implemented after operation 693, it is to be appreciated that operation 694 may be executed at the same time as operation 693 or before operation 693.

In an embodiment, the process 690 may continue with operation 695, which comprises obtaining operating windows for the variable tuning elements in the plurality of RF impedance matches. In an embodiment, this operation 695 may include adjusting the motor steps of a variable capacitor in order to more accurately match the RF impedance matches to each other.

Figure 7A:
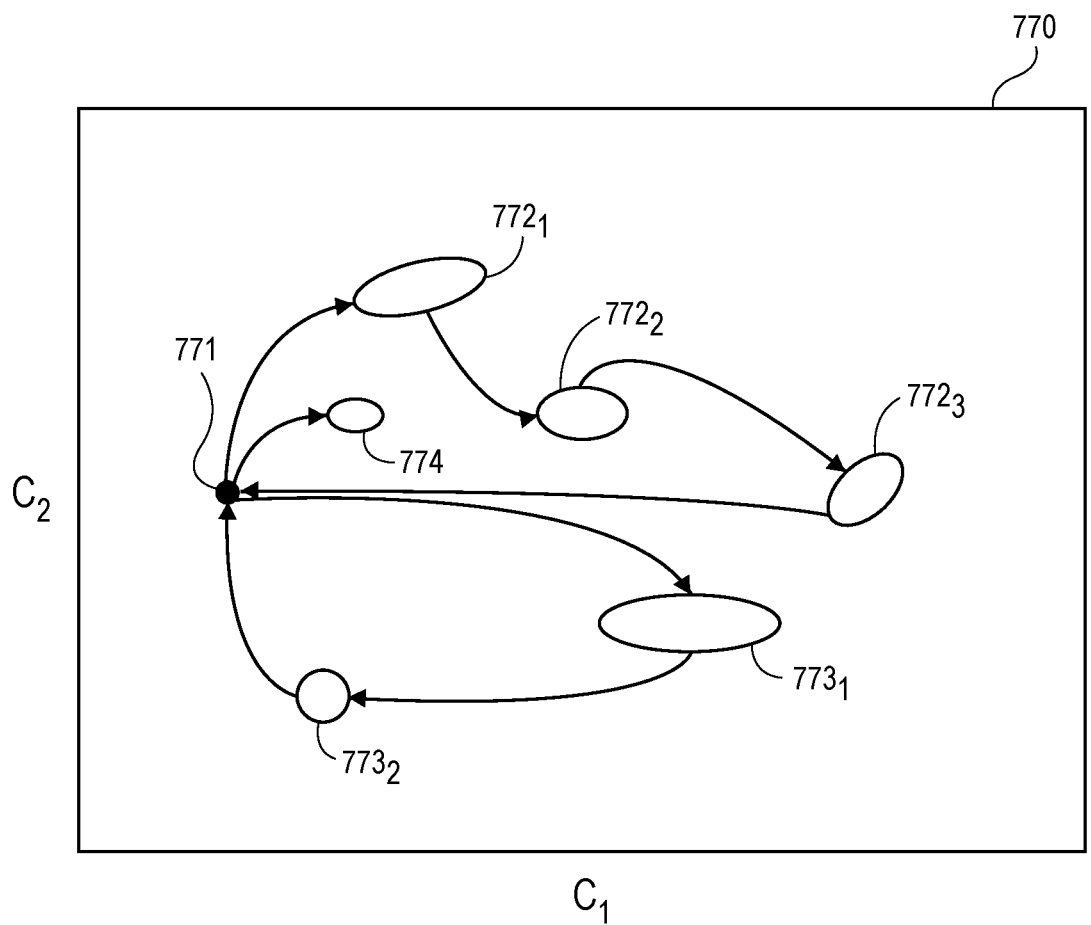
FIG. 7A is a schematic of a performance template space that illustrates the probabilistic paths between templates, in accordance with an embodiment.

Referring now to FIG. 7A, a chart of a performance template space 770 is shown, in accordance with an embodiment. In an embodiment, the performance template space 770 comprises a start point 771. The start point 771 may correspond to the condition of a semiconductor processing chamber before the ignition of a plasma. That is, the start point 771 may be the first operation of a process recipe, or a condition of the semiconductor processing chamber before the start of a process recipe. In an embodiment, the probabilistic traces (arrows) may provide paths to subsequent templates 772. As shown, the probabilistic traces may link together a sequence of templates $772_1$-$772_3$. Similarly, probabilistic traces may link together a second sequence of templates $773_1$-$773_2$. The series of templates 772 and 773 may ultimately loop back to the start point 771 in order to restart a process recipe.

In an embodiment, the probabilistic traces may be the probability of going from one template to another template. The illustrated probabilistic traces are high probabilistic values. Less probable traces are omitted. The probabilities of a given trace may be dependent on one or more variables of the processing environment, chamber aging, process recipe conditions, and the like.

In the illustrated embodiment, each of the templates 772 and 773 are different sized envelopes in the $C_1$-$C_2$ space. Each template 772 may refer to a step in a process recipe. If values are outside of the templates 772 and 773, it may be an indication that an excursion has occurred, as will be described in greater detail below.

In an embodiment, the templates 772 and 773 may be established points over the course of repeated iterations of a process recipe. However, the performance template space 770 may also include new process routines. For example, template 774 may be a new template that is being investigated by the performance template space 770. Alternatively, the template 774 may be an indication of an excursion away from the existing templates 772 and 773.

Figure 7B:
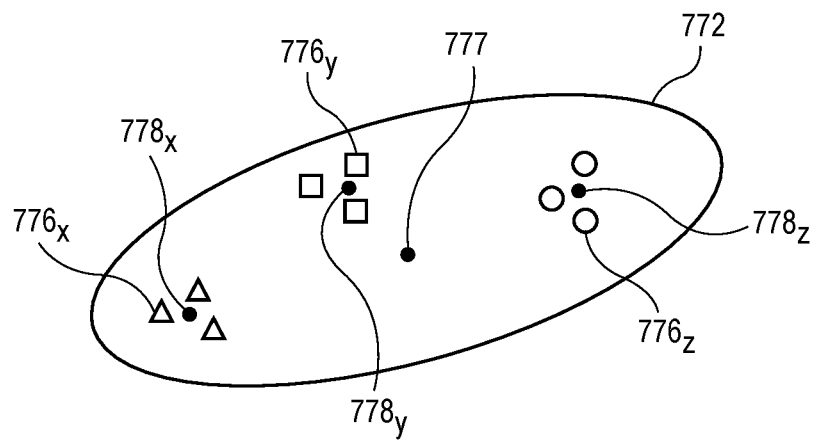
FIG. 7B is an illustration of a template with RF match clusters and centroids, in accordance with an embodiment.

Referring now to FIG. 7B, a more detailed illustration of one of the templates 772 is shown, in accordance with an embodiment. In an embodiment, the template 772 may comprise a set of clusters for different RF matches. For example, the triangular points may be for RF match X clusters $776_X$, the square points may be for RF match Y clusters $776_Y$, and the circular points may be for RF match Z clusters $776_Z$. Each match may have a cluster centroid $778_{X-Z}$. The template 772 may also have a centroid 777. As can be appreciated the variation between the RF matches X, Y, and Z can be grouped into a cluster that is within a single template 772.

Figure 8A:
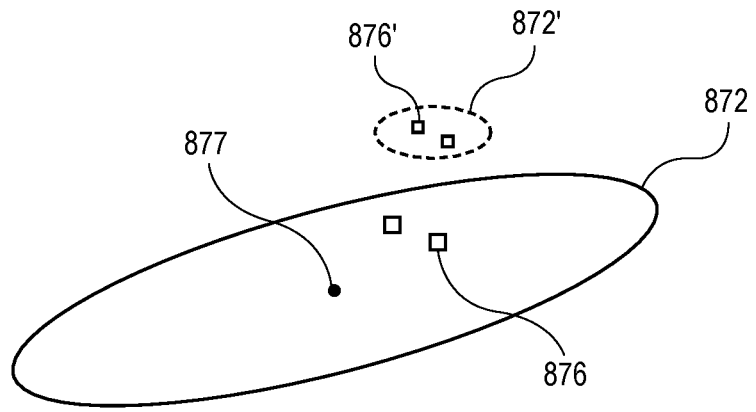
FIG. 8A is a schematic of a pair of templates that illustrate a first type of excursion event, in accordance with an embodiment.

Referring now to FIG. 8A, an illustration of a template 872 is shown, in accordance with an embodiment. The template 872 may include clusters 876 and a centroid 877. In an embodiment, excursion template 872' may be provided outside of the template 872. The excursion template 872' may include clusters 876'. Since the excursion template 872' is outside of the template 872, it is considered to be an excursion event. The identification of an excursion event may trigger a warning that operations are outside of a predetermined process envelope. This could be an indication that the processing tool needs cleaning, maintenance, or the like.

Figure 8B:
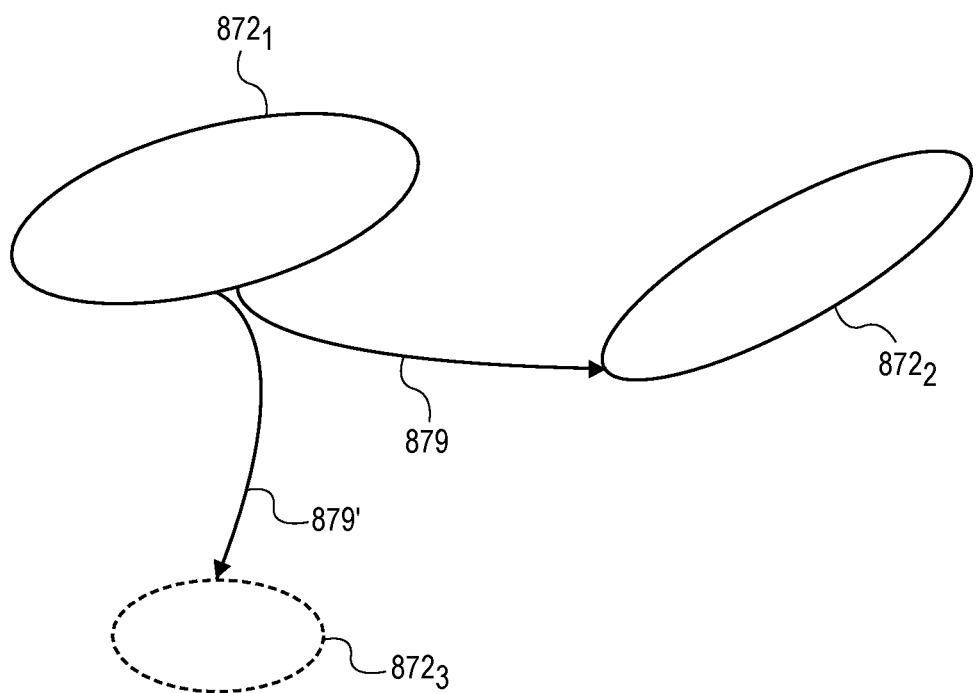
FIG. 8B is a schematic of templates that illustrate a compliant trace between templates and a non-compliant excursion trace between templates, in accordance with an embodiment.

Referring now to FIG. 8B, an illustration of a second type of excursion event is shown, in accordance with an embodiment. As shown, a first template $872_1$ is provided. A probabilistic trace 879 leads to a second template $872_2$. For example, the first template $872_1$ may be the $i^{th}$ template point and the second template $872_2$ may be the $i^{th}+1$ template point. However, an excursion may occur when the probabilistic trace 879' diverges from the probabilistic trace 879 and leads to a third template $872_3$. That is, excursions may occur when the subsequent template 872 is outside of a determined process envelope, and/or when the probabilistic trace 879' diverges from an expected probabilistic trace 879.

Figure 9:
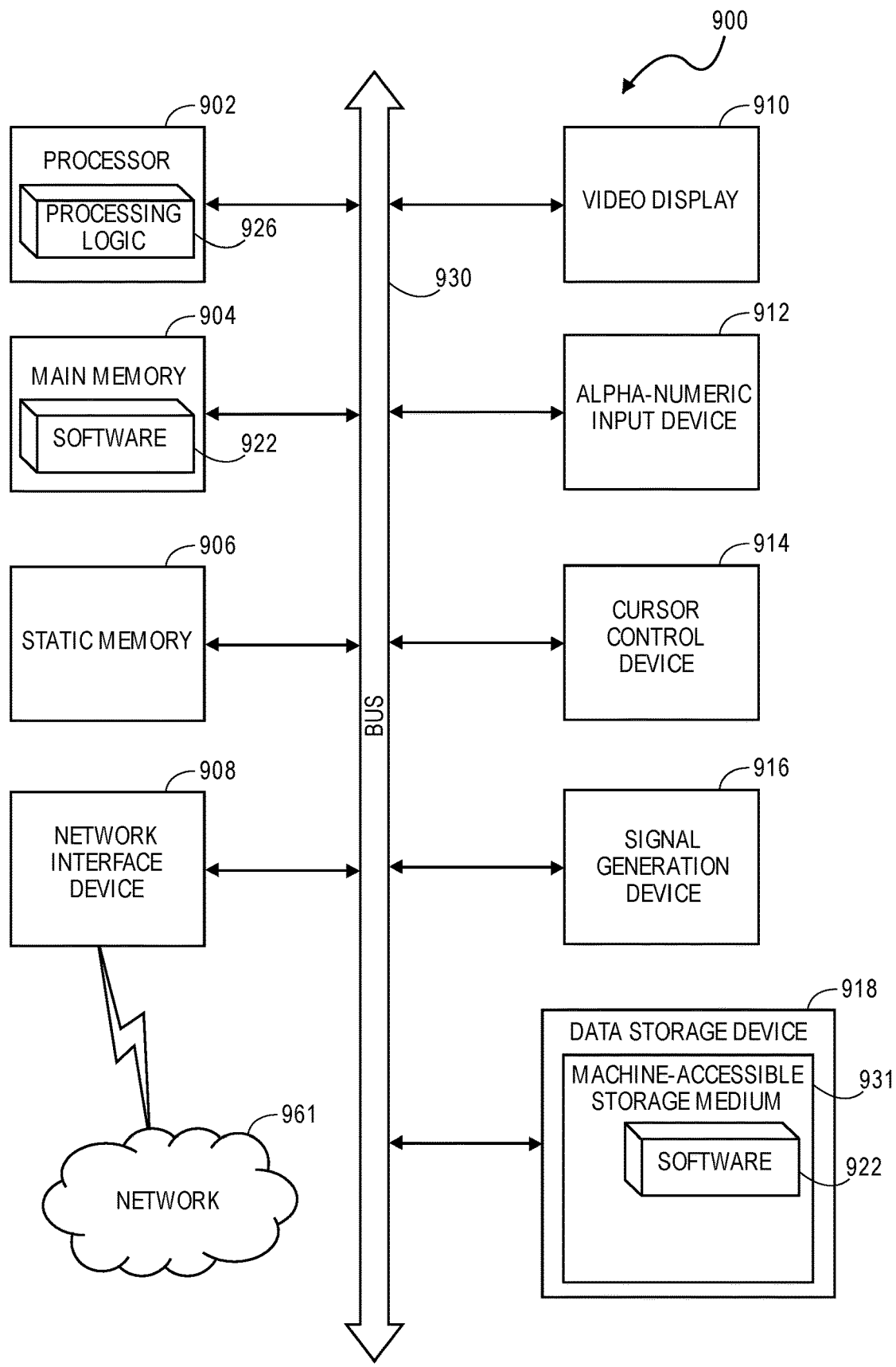
FIG. 9 illustrates a block diagram of an exemplary computer system that may be used in conjunction with a processing tool, in accordance with an embodiment.

Referring now to FIG. 9, a block diagram of an exemplary computer system 900 of a processing tool is illustrated in accordance with an embodiment. In an embodiment, computer system 900 is coupled to and controls processing in the processing tool. Computer system 900 may be connected (e.g., networked) to other machines in a Local Area Network (LAN), an intranet, an extranet, or the Internet. Computer system 900 may operate in the capacity of a server or a client machine in a client-server network environment, or as a peer machine in a peer-to-peer (or distributed) network environment. Computer system 900 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 900, the term "machine" shall also be taken to include any collection of machines (e.g., computers) that individually or jointly execute a set (or multiple sets) of instructions to perform any one or more of the methodologies described herein.

Computer system 900 may include a computer program product, or software 922, having a non-transitory machine-readable medium having stored thereon instructions, which may be used to program computer system 900 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 900 includes a system processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

System processor 902 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets.

System processor 902 may also be one or more special-purpose processing devices such as an application specific integrated circuit (ASIC), a field programmable gate array (FPGA), a digital signal system processor (DSP), network system processor, or the like. System processor 902 is configured to execute the processing logic 926 for performing the operations described herein.

The computer system 900 may further include a system network interface device 908 for communicating with other devices or machines. The computer system 900 may also include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium 932 (or more specifically a computer-readable storage medium) on which is stored one or more sets of instructions (e.g., software 922) embodying any one or more of the methodologies or functions described herein. The software 922 may also reside, completely or at least partially, within the main memory 904 and/or within the system processor 902 during execution thereof by the computer system 900, the main memory 904 and the system processor 902 also constituting machine-readable storage media. The software 922 may further be transmitted or received over a network 920 via the system network interface device 908. In an embodiment, the network interface device 908 may operate using RF coupling, optical coupling, acoustic coupling, or inductive coupling.

While the machine-accessible storage medium 932 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A method for field adjusting calibrating factors of a plurality of RF impedance matches for control of a plurality of plasma chambers, comprising:
    collecting and storing in a memory data from operation of the plurality of RF impedance matches;
    finding a tune space for each of the plurality of RF impedance matches from the collected data;
    finding adjustments to account for variability in each of the plurality of RF impedance matches;
    finding adjustments to variable tuning elements of the plurality of RF impedance matches to account for time varying and process related load impedances; and
    obtaining operating windows for the variable tuning elements in the plurality of RF impedance matches.

2. The method of claim 1, wherein each tune space comprises a cluster, wherein each cluster includes a setting for a first variable tuning element and a second variable tuning element of each of the plurality of RF impedance matches.

3. The method of claim 2, wherein finding adjustments to variable tuning elements of each of the plurality of RF impedance matches comprises finding an optimal data reconciliation of clusters to minimize impedance tuning variability.

4. The method of claim 3, wherein finding clusters and subsequent data reconciliation provides feedback to a manufacturing operation digital twin.

5. The method of claim 2, wherein finding clusters creates an operational template to predict process excursions.

6. The method of claim 1, wherein the plurality of RF impedance matches are characterized in a two-dimensional space with coordinates for a first tuning element and a second tuning element.

7. The method of claim 1, wherein the plurality of RF matches are characterized in any hyper dimensional representation.

8. The method of claim 1, wherein the memory is a local memory or a remote memory.

9. The method of claim 1, wherein the variability in each of the plurality of RF impedance matches includes process variability, device variability, and/or aging effects.

10. A method for field adjusting calibrating factors of a plurality of RF impedance matches with a first variable tuning element and a second variable tuning element for control of a plurality of plasma chambers, comprising:
    collecting data for the plurality of RF impedance matches;
    clustering the collected data into a plurality of data clusters;
    reconciling the data clusters to minimize impedance tuning variability between the plurality of RF impedance matches; and
    updating calibration factors for each of the plurality of RF impedance matches using the data reconciliation.

11. The method of claim 10, wherein updating calibration terms includes setting a minimum and a maximum for each of the first variable tuning elements and the second variable tuning elements.

12. The method of claim 10, wherein each data cluster includes a setting for each of the first variable tuning elements and the second variable tuning elements.

13. The method of claim 10, wherein the plurality of RF impedance matches includes at least a first RF impedance match and a second RF impedance match.

14. The method of claim 10, further comprising:
    feeding back the updated calibration factors for use in the data collection process for iterative learning.

15. The method of claim 10, wherein reconciling data to minimize impedance tuning variability between the plurality of RF impedance matches includes linear equality constraints, linear inequality constraints, nonlinear equality constraints, or nonlinear inequality constraints.

16. The method of claim 10, wherein the clustering creates an operational template to predict process excursions.

17. A plasma processing system, comprising:
    a controller;
    a plurality of plasma chambers, wherein each plasma chamber comprises an RF match; and
    wherein the controller is configured to calibrate the RF matches for the plurality of plasma chambers using an RF match correction algorithm.

18. The plasma processing system of claim 17, wherein the RF match correction algorithm uses an optimization to satisfy a linearity constraint.

19. The plasma processing system of claim 17, further comprising:
    feeding back the updated calibration factors for use in the data collection process for iterative learning.

\* \* \* \* \*